US009625536B2

(12) United States Patent
Sugino

(10) Patent No.: US 9,625,536 B2
(45) Date of Patent: Apr. 18, 2017

(54) MAGNETIC SENSOR AND METHOD FOR MANUFACTURING THE SAME

(71) Applicant: Mitsubishi Electric Corporation, Chiyoda-ku, Tokyo (JP)

(72) Inventor: Takaki Sugino, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 191 days.

(21) Appl. No.: 14/167,639

(22) Filed: Jan. 29, 2014

(65) Prior Publication Data

US 2015/0108973 A1   Apr. 23, 2015

(30) Foreign Application Priority Data

Oct. 17, 2013   (JP) .................. 2013-216109

(51) Int. Cl.
*G01R 33/09* (2006.01)
*C23F 4/00* (2006.01)
*G01R 33/00* (2006.01)

(52) U.S. Cl.
CPC ............ *G01R 33/09* (2013.01); *C23F 4/00* (2013.01); *G01R 33/0029* (2013.01); *G01R 33/0052* (2013.01)

(58) Field of Classification Search
CPC ....... H01L 21/7685; H01L 2224/32245; H01L 2224/48235; H01L 2224/83; H01L 31/1824; H01L 43/08; H01F 1/24; H01F 1/33; H01F 41/0246; H01F 41/125; H01F 17/0013; H01F 2017/0086; H01F 2038/143; G01R 33/09; G01R 33/0052; G01R 3/00; C23F 4/00

USPC .................. 324/249, 252, 207.21
See application file for complete search history.

(56) References Cited

U.S. PATENT DOCUMENTS

| | | | |
|---|---|---|---|
| 5,471,084 A * | 11/1995 | Suzuki et al. ................. 257/421 |
| 6,239,595 B1 | 5/2001 | Shinjo et al. | |
| 6,426,620 B1 * | 7/2002 | Taguchi et al. .......... 324/207.21 |
| 6,891,368 B2 * | 5/2005 | Kawano et al. ............. 324/252 |
| 7,114,240 B2 * | 10/2006 | Baseman et al. .......... 29/603.15 |

(Continued)

FOREIGN PATENT DOCUMENTS

| | | |
|---|---|---|
| DE | 19854713 A1 | 11/1999 |
| DE | 102007037845 A1 | 9/2008 |

(Continued)

OTHER PUBLICATIONS

Communication dated Aug. 5, 2014 from the Japanese Patent Office in counterpart Japanese Patent Application No. 2013-216109.

(Continued)

*Primary Examiner* — Vinh Nguyen
(74) *Attorney, Agent, or Firm* — Sughrue Mion, PLLC; Richard C. Turner

(57) ABSTRACT

An object is to achieve miniaturization and an increase in performance of a magnetic sensor device, and the magnetic sensor according to the present invention has a magnetic film and a metal electrode to be electrically coupled to the magnetic film, the magnetic film and the metal electrode constituting a magnetic sensor portion. The metal electrode is formed with level difference portions, and the magnetic film is formed on the level difference portions and sidewalls that connect the level difference portions.

8 Claims, 5 Drawing Sheets

(56) References Cited

U.S. PATENT DOCUMENTS

| | | | |
|---|---|---|---|
| 7,675,286 B2* | 3/2010 | Hosomi et al. | 324/252 |
| 9,368,177 B2* | 6/2016 | Suh | G11C 11/161 |
| 2002/0153881 A1 | 10/2002 | Taguchi et al. | |
| 2002/0186011 A1* | 12/2002 | Murata | B82Y 25/00 |
| | | | 324/252 |
| 2003/0197503 A1 | 10/2003 | Kawano et al. | |
| 2004/0174164 A1 | 9/2004 | Ao | |
| 2007/0018642 A1 | 1/2007 | Ao | |
| 2008/0218163 A1 | 9/2008 | Hosomi et al. | |
| 2009/0057795 A1 | 3/2009 | Ishio | |
| 2010/0141251 A1 | 6/2010 | Ando et al. | |
| 2010/0283457 A1 | 11/2010 | Ando et al. | |
| 2012/0212219 A1* | 8/2012 | Akiyama | B82Y 25/00 |
| | | | 324/252 |

FOREIGN PATENT DOCUMENTS

| | | |
|---|---|---|
| JP | 57-173959 A | 10/1982 |
| JP | 60-101968 A | 6/1985 |
| JP | 5-121793 A | 5/1993 |
| JP | H06072265 U | 10/1994 |
| JP | 2003315432 A | 11/2003 |
| JP | 2004-264205 A | 9/2004 |
| JP | 2009-076888 A | 4/2009 |

OTHER PUBLICATIONS

Communication dated Jun. 30, 2015 from the German Patent and Trademark Office in counterpart application No. 102014203075.7.

* cited by examiner

MAGNETIC SENSOR AND METHOD FOR MANUFACTURING THE SAME

BACKGROUND OF THE INVENTION

1. Field of the Invention

The present invention relates to the device structure of a magnetic sensor and a method for manufacturing the same, both of which are conducive to miniaturization of the magnetic sensor.

2. Description of the Related Art

There is proposed the device structure of a magnetic sensor which is configured by forming a magnetic sensor portion having a magnetoresistance effect and a signal processing circuit portion which reads out the signal of the magnetic sensor portion on the same substrate; and in recent years, in the stream where miniaturization and an increase in performance of such a magnetic sensor device are advanced, the development of a magnetic sensor having a monolithic structure as disclosed in, for example, Japanese Unexamined Patent Publication No. 2004-264205 (Patent Document 1) or Japanese Unexamined Patent Publication No. 2009-076888 (Patent Document 2) is actively performed.

On the other hand, in the magnetic sensor device having this monolithic structure, the electrical signal from the magnetic sensor portion is read out by the signal processing circuit; and thus, for example, an electrical coupling portion which uses a metal wiring made of, for example, aluminum or the like is needed. The aforementioned Patent Document 1 discloses the device structure of the magnetic sensor which uses aluminum as the metal wiring layer and forms magnetic material directly on the metal wiring layer.

In the device structure of this magnetic sensor, miniaturization of a contact portion to be electrically coupled to the signal processing circuit portion is difficult in the advancement of miniaturization of the magnetic sensor device. More specifically, in order to secure a contact resistance value nearly equal to a conventional type, a contact area equal to a conventional one is needed. Thus, the area percentage of a contact region occupied in the whole magnetic sensor portion increases as the miniaturization of the magnetic sensor device is advanced. Accordingly, the device structures disclosed in Patent Document 1 and Patent Document 2 can be said to be a structure which is inept in the miniaturization of the magnetic sensor.

[Patent Document 1] Japanese Unexamined Patent Publication No. 2004-264205 (see FIG. 4 of Patent Document 1)

[Patent Document 2] Japanese Unexamined Patent Publication No. 2009-076888

As described above, in the device structure of the conventional magnetic sensor disclosed in Patent Document 1, when the contact portion having electrical coupling with the magnetic material is miniaturized, an increase in contact resistance is caused and accordingly the advancement of the miniaturization of the magnetic sensor device is difficult. More specifically, the increase in contact resistance due to a reduction in contact area leads to that parasitic resistance of the contact portion cancels a resistance changing rate of the magnetic sensor in appearance, and sensitivity of the magnetic sensor deteriorates.

BRIEF SUMMARY OF THE INVENTION

This invention has been made to solve the problem as described above, and an object of the present invention is to provide the device structure of a magnetic sensor and a method for manufacturing the magnetic sensor. Both of the device structure and the method are easy to miniaturize a contact portion between a magnetic film and a metal electrode to be electrically coupled to the magnetic film, both of the magnetic film and the metal electrode constituting a magnetic sensor portion; and both of the device structure and the method are also capable of providing contact resistance to be equal to or lower than conventional one.

According to the present invention, there is provided a magnetic sensor which utilizes a magnetoresistance effect, the magnetic sensor including: a magnetic sensor portion; and a signal processing circuit portion which reads out a signal from the magnetic sensor portion and processes. The magnetic sensor portion includes: a magnetic film; and a metal electrode to be electrically coupled to the magnetic film, the metal electrode being provided with level difference portions, and the magnetic film being formed on the level difference portions and sidewalls that connect the level difference portions.

Furthermore, according to the present invention, there is provided a method for manufacturing a magnetic sensor which utilizes a magnetoresistance effect, the magnetic sensor including: a magnetic sensor portion; and a signal processing circuit portion which reads out a signal from the magnetic sensor portion and processes. The method for the manufacturing the magnetic sensor includes: a step of providing a metal wiring film on a supporting substrate; a step of processing the metal wiring film into a desired pattern shape to form a metal electrode having level differences; a step of providing a magnetic film on the metal electrode; and a step of providing a passivation film on the magnetic film.

According to the present invention, the magnetic film is formed on the level difference portions of the metal electrode and the sidewalls that connect the level difference portions, whereby a contact area between the metal electrode and the magnetic film increases and a contact portion serving as a flat surface can be miniaturized. Furthermore, there also obtains an effect that resistance of a part which does not contribute to sensitivity is suppressed and sensitivity as the magnetic sensor can be improved.

The foregoing and other objects, features, and advantageous effects of the present invention will become more apparent from detailed description in the following embodiments and description in the accompanying drawings.

DETAILED DESCRIPTION OF THE INVENTION

Embodiment 1

Hereinafter, the present invention will be described in detail with reference to drawings that are embodiments.

Figure 1:
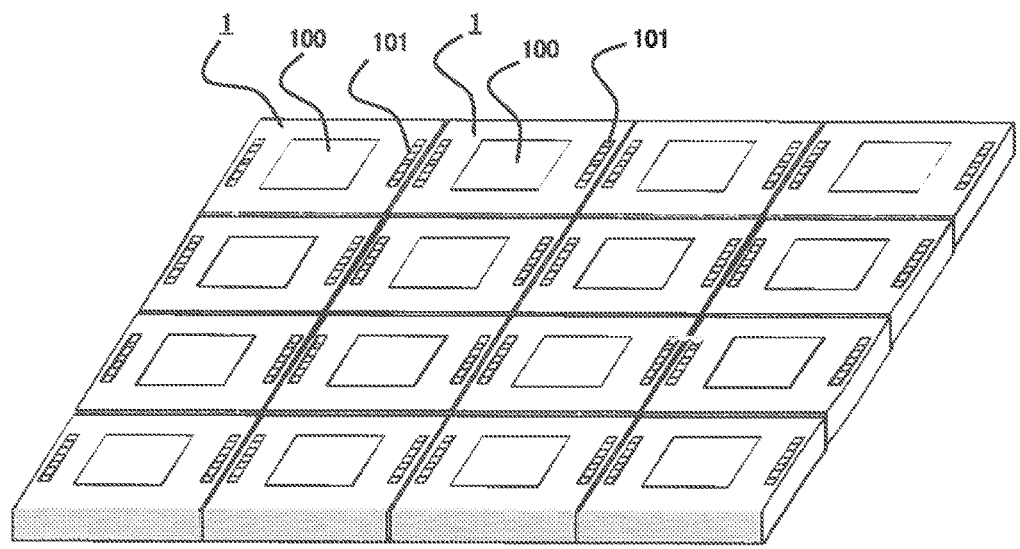
FIG. 1 is a perspective view showing an exterior appearance in the manufacturing process of a magnetic sensor according to Embodiment 1 of the present invention.

FIG. 1 is a perspective view showing an exterior appearance in the manufacturing process of a magnetic sensor according to Embodiment 1 of the present invention.

In the drawing, a magnetic sensor device 1 is composed of a "magnetic sensor portion and signal processing circuit portion" 100 which reacts with magnetism and reads out as an electrical signal and a bonding pad portion 101 which is for supplying voltage or the like that drives the device and outputting the signal to the outside. A plurality of element portions of these "magnetic sensor portion and signal processing circuit portion" 100 and bonding pad portion 101 are arranged on a semiconductor substrate and are manufactured at the same time.

Figure 2:
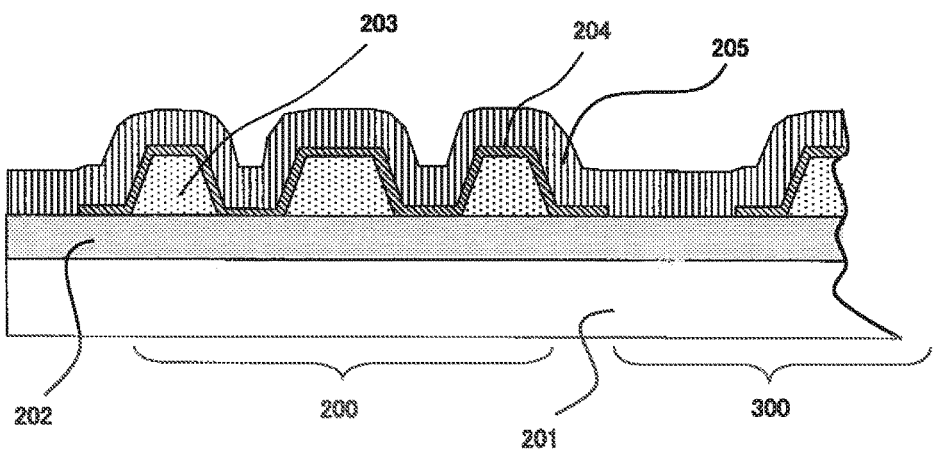
FIG. 2 is a sectional view showing a relevant part of the magnetic sensor in FIG. 1.

FIG. 2 shows a cross-section of a magnetic sensor portion 200 in a simple body of this magnetic sensor device 1; and a configuration is made such that an oxide film 202, a metal wiring film 203, a magnetic film 204, and a passivation film 205 are formed in order of precedence on a supporting substrate 201. Furthermore, a signal processing circuit portion 300 is similarly manufactured by being apposed with the magnetic sensor portion 200; however, hereinafter, only the magnetic sensor portion 200 intended by the present invention will be described and a description of the manufacturing process of the signal processing circuit portion 300 will be omitted.

FIGS. 3A to 3E are each a sectional view showing the manufacturing process of the magnetic sensor device 1 according to Embodiment 1 of the present invention. Hereinafter, the manufacturing process according to Embodiment 1 will be described in accordance with the drawings.

Figure 3A:
FIGS. 3A to 3E are each a sectional view showing the manufacturing process of a relevant part of the magnetic sensor in FIG. 2.
Figure 3B:
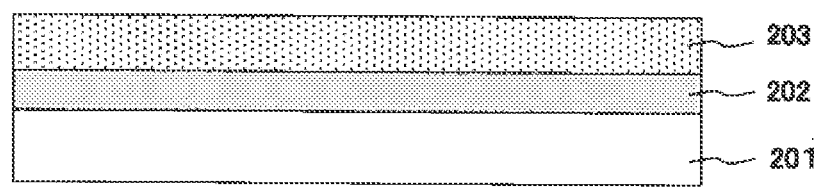

Firstly, as shown in FIG. 3A, a supporting substrate in which the oxide film 202 is formed on the bare silicon (Si) substrate 201 up to a film thickness of, for example, 500 nm, is prepared. Next, as shown in FIG. 3B, metal such as aluminum (Al), titanium (Ti), and platinum (Pt) is deposited to form the metal wiring film 203 by, for example, a physical vapor deposition (PVD) apparatus. The metal wiring film 203 is to be a metal electrode of the magnetic sensor portion 200. In this case, the metal wiring film 203 is not subject to particular constraint if material is low in electrical resistance value.

Figure 3C:
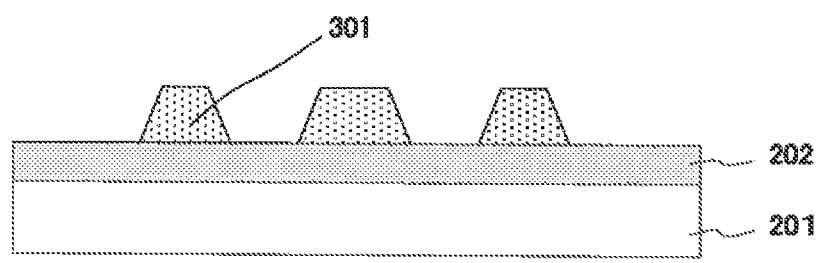
Figure 4:
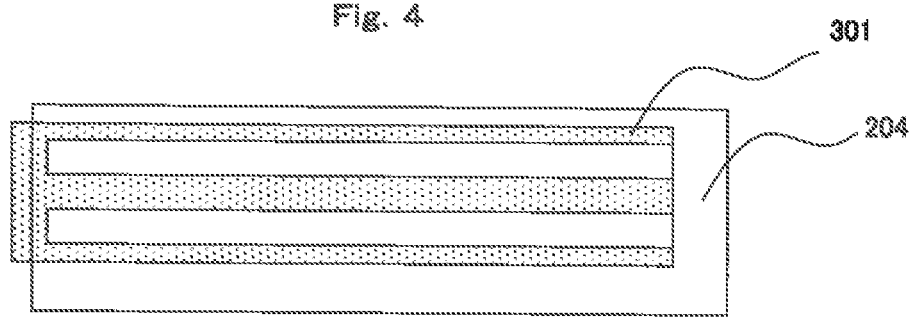
FIG. 4 is a plan view showing a relevant part of the magnetic sensor in FIG. 2.

Next, as shown in FIG. 3C, a part of the metal wiring film 203 is removed by etching to form the metal electrode 301 made of a desired pattern using, for example, a technique such as photoengraving. The pattern of the metal electrode 301 is formed such that the metal wiring film 203 is removed until the upper surface of the oxide film 202 is exposed, the cross section of the metal electrode 301 is formed in a trapezoidal shape to provide level differences, and the flat surface thereof is formed in a comb shape as shown in FIG. 4. Incidentally, the flat surface is not the comb shape, but may be a ladder shape whose both ends are connected.

Figure 3D:
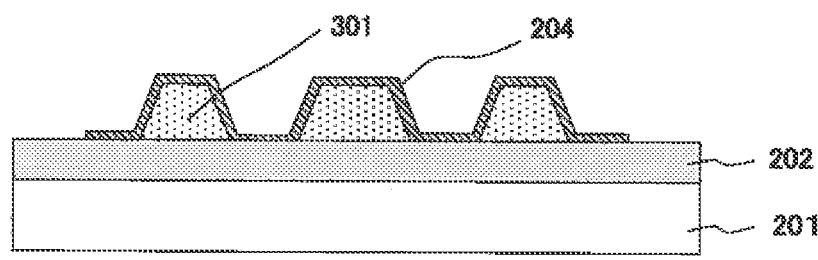

After that, as shown in FIG. 3D, the magnetic film 204 is deposited on the metal wiring film 203 using the PVD apparatus. Incidentally, as magnetic material of the magnetic film 204, specifications and/or characteristics of the film are not particularly defined, but even if the magnetic film has any lamination structure, film type, material, or film thickness, it may be permissible if the magnetic film has a magnetoresistance effect.

Next, a part of the magnetic film 204 is selectively removed by etching to form the desired pattern using a technique such as the photoengraving. In this case, as for the magnetic film 204, the whole of the magnetic film 204 of a place of no use as the magnetic sensor portion 200 is removed by etching using, for example, an ion beam etching (IBE) apparatus and etching is selectively performed for the etching time at which the metal electrode 301 does not lose a function as an electrode. Incidentally, the term "having the function as the electrode" means a film thickness by which reliability is ensured at least for ten years even when electrical and physical stress are applied on the metal electrode 301 layer. More specifically, simply, it means a film thickness by which electromigration characteristics are ensured.

Figure 3E:
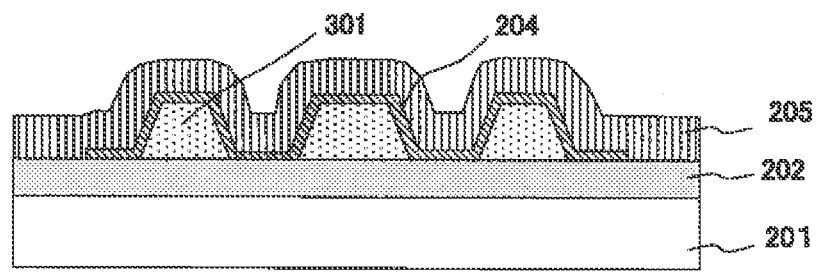

Further, as shown in FIG. 3E, in order to protect the surface of the magnetic sensor portion 200, for example, a silicon nitride film is deposited up to a film thickness by which a function as what is called the passivation film 205 is sufficiently guaranteed using a plasma-enhanced chemical vapor deposition (PECVD) apparatus.

Incidentally, the term "having the function as the passivation film" means a film thickness by which reliability as the device is ensured at least for ten years even when physical impact or chemical stress is applied on the surface of the magnetic sensor portion 200.

Lastly, in this case, a bonding pad portion 101 (not shown in the drawing) is formed by removing by etching by the photoengraving technique and a reactive ion etching (RIE) apparatus.

Furthermore, the signal processing circuit portion 300 is formed by a similar process to manufacture the magnetic sensor device 1 having the comb-shaped metal electrode 301.

As described above, in the magnetic sensor device 1 in Embodiment 1, the metal electrode 301 is formed in the comb shape or the ladder shape and thus providing the level difference portions; the magnetic film 204 can also be formed along sidewalls that connect the level difference portions; and the metal electrode 301 and the magnetic film 204 can be electrically coupled. Therefore, a contact area between the metal electrode 301 and the magnetic film 204 can be increased as compared to the conventional magnetic sensor structure. In other words, when the device that needs contact resistance equal to conventional one is designed, a plane area needed for an electrode portion can be decreased and miniaturization of the device becomes easy.

Embodiment 2

FIGS. 5A to 5E are each a sectional view showing a manufacturing process of a magnetic sensor device 1 according to Embodiment 2 of the present invention. Hereinafter, the manufacturing process according to Embodiment 2 will be described in accordance with the drawings.

Figure 5A:
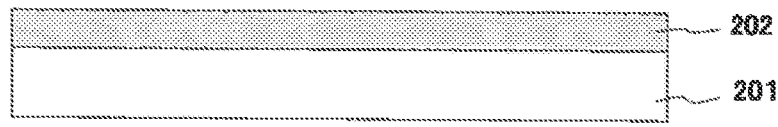
FIGS. 5A to 5E are each a sectional view showing the manufacturing process of a relevant part of a magnetic sensor in Embodiment 2 of the present invention.
Figure 5B:
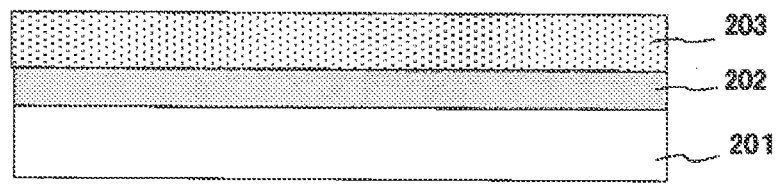

Firstly, as shown in FIG. 5A, a supporting substrate in which an oxide film 202 is formed on a bare silicon (Si) substrate 201 up to a film thickness of, for example, 500 nm, is prepared; and then, as shown in FIG. 5B, metal such as aluminum (Al), titanium (Ti), and platinum (Pt) is deposited to form a metal wiring film 203 by, for example, the physical vapor deposition (PVD) apparatus. The metal wiring film 203 is to be a metal electrode of a magnetic sensor portion 200. In this case, the metal wiring film 203 is not subject to particular constraint if material is low in electrical resistance value.

Figure 6:
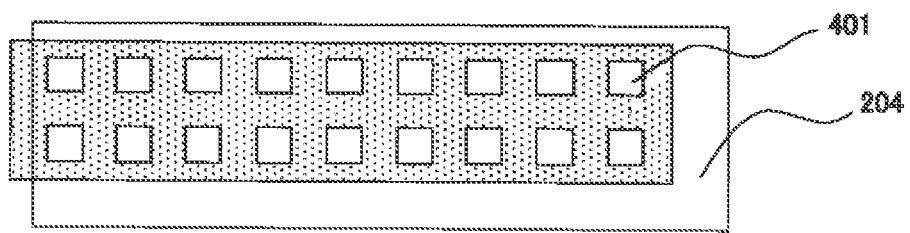
FIG. 6 is a plan view showing a relevant part of the magnetic sensor in FIGS. 5A to 5E.
Figure 5C:
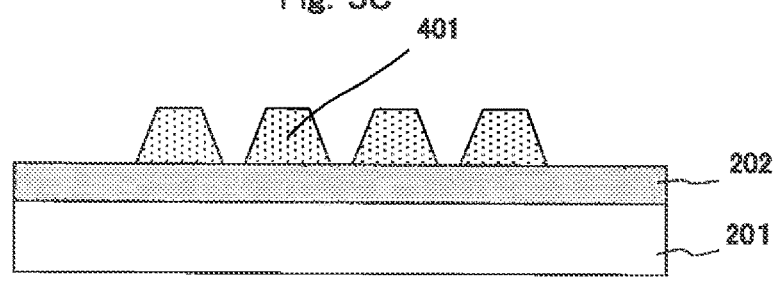
Figure 5D:
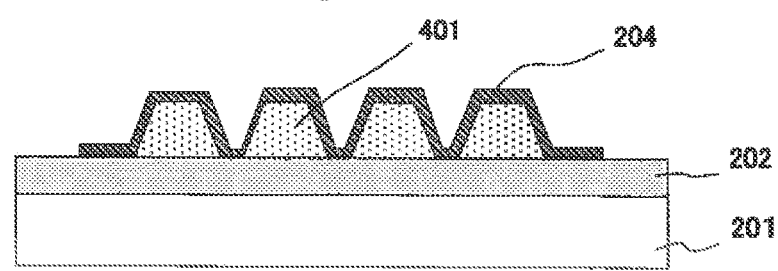
Figure 5E:
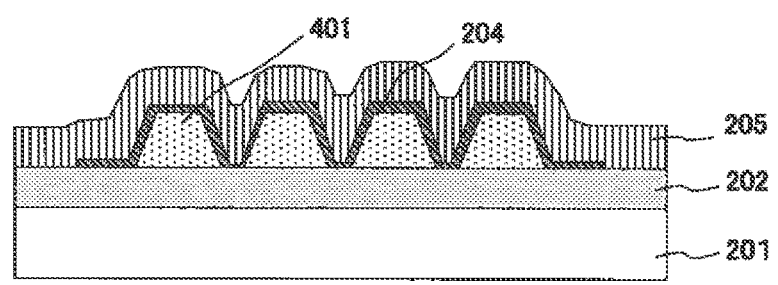

Next, as shown in FIG. 5C, the metal wiring film 203 is removed by etching to form a metal electrode 401 made of a desired pattern using, for example, a technique such as the photoengraving. The pattern of the metal electrode 401 is formed such that the metal wiring film 203 is removed until the upper surface of the oxide film 202 is exposed, the cross section of the metal electrode 401 is formed in a trapezoidal shape to provide level differences, and the flat surfaces thereof is formed in a dot shape as shown in FIG. 6. Incidentally, it goes without saying that the term "dot shape" may be a circle, an ellipse, or all rectangles including polygonal shapes.

After that, similarly to Embodiment 1, a magnetic film 204 (FIG. 5D) and a passivation film 205 (FIG. 5E) are formed in order of precedence to manufacture the magnetic sensor portion 200.

Lastly, a bonding pad portion 101 and a signal processing circuit portion 300 (not shown in the drawing) are formed to complete a magnetic sensor device 1 having the dot shaped metal electrode 401.

As described above, in the magnetic sensor device 1 in Embodiment 2, the metal electrode 401 is formed in the dot shape and thus providing the level difference portions; the magnetic film 204 can also be formed along sidewalls that connect the level difference portions; and the metal electrode 301 and the magnetic film 204 can be electrically coupled. Therefore, a contact area with the magnetic film can be increased as compared to the conventional magnetic sensor structure. In other words, when the device that needs contact resistance equal to conventional one is designed, a plane area needed for an electrode portion can be decreased and miniaturization of the device becomes easy.

Embodiment 3

FIGS. 7A to 7E are each a sectional view showing a manufacturing process of a magnetic sensor device 1 according to Embodiment 3 of the present invention. Hereinafter, the manufacturing process according to Embodiment 3 will be described.

Figure 7A:
FIGS. 7A to 7E are each a sectional view showing the manufacturing process of a relevant part of a magnetic sensor in Embodiment 3 of the present invention.
Figure 7B:
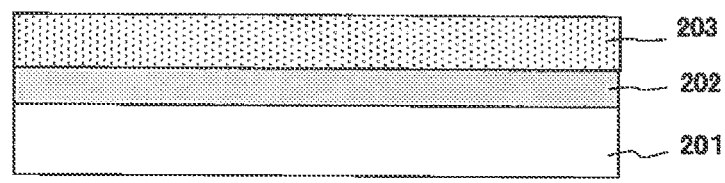

Firstly, as shown in FIG. 7A, a supporting substrate in which an oxide film 202 is formed on a bare silicon (Si) substrate 201 up to a film thickness of, for example, 500 nm, is prepared; and then, as shown in FIG. 7B, metal such as aluminum (Al), titanium (Ti), and platinum (Pt) is deposited to form a metal wiring film 203 by, for example, the physical vapor deposition (PVD) apparatus. The metal wiring film 203 is to be a metal electrode of a magnetic sensor portion 200. In this case, the metal wiring film 203 is not subject to particular constraint if material is low in electrical resistance value.

Figure 7C:
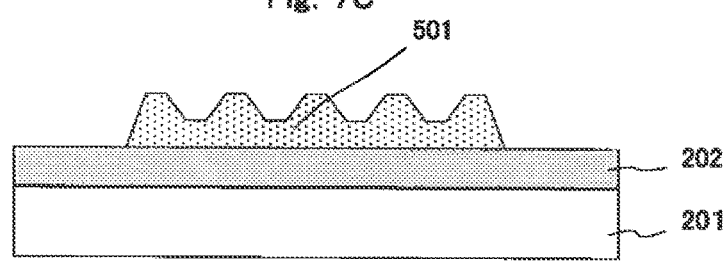
Figure 7D:
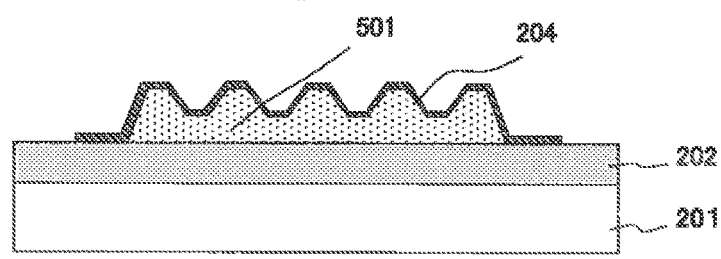
Figure 7E:
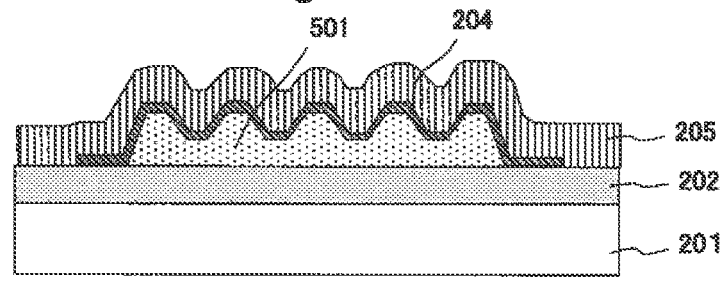

Next, as shown in FIG. 7C, the metal wiring film 203 is removed by etching to form a metal electrode 501 made of a desired pattern using, for example, a technique such as the photoengraving. The pattern of the metal electrode 501 is made such that the upper surface of the metal electrode 501 is formed in the comb shape, the ladder shape, or the dot shape, which is the same as the electrode shape in Embodiment 1 or 2, and etching processing is stopped in mid-flow to remain the metal wiring film 203 also on the bottom surface of a concave portion.

After that, similarly to Embodiments 1 and 2, a magnetic film 204 (FIG. 7D) and a passivation film 205 (FIG. 7E) are formed in order of precedence to manufacture the magnetic sensor portion 200.

As described above, in the magnetic sensor device 1 in Embodiment 3, the etching is stopped in mid-flow to form the metal electrode 501 and thus providing level difference portions; the magnetic film 204 can also be formed along sidewalls that connect the level difference portions and the bottom surface; and the metal electrode 501 and the magnetic film 204 can be electrically coupled. Therefore, a contact area between the metal electrode 501 and the magnetic film 204 can be increased as compared to the conventional magnetic sensor structure. In other words, when the device that needs contact resistance equal to conventional one is designed, a plane area needed for an electrode portion can be decreased and miniaturization of the device becomes easy.

Furthermore, the etching is stopped in mid-flow; and thus, the level difference of the metal electrode provided on the contact portion can be lowered, and focus depth in the case of performing microfabrication by an exposure apparatus can be easily shallowed. Therefore, an advantage also exists in that pattern accuracy during exposure can be improved.

As described above, according to the magnetic sensor of the present invention, the magnetic film can be formed on the level difference portions of the metal electrode and the sides that connect the level difference portions, and the contact area between the metal electrode and the magnetic film can be increased. As a result, this can be conducive to miniaturization of the magnetic sensor.

Incidentally, in the present invention, the embodiments can be appropriately changed in shape or omitted within the scope of the present invention.

What is claimed is:

1. A magnetic sensor which utilizes a magnetoresistance effect, the magnetic sensor including:
    a magnetic sensor portion; and
    a signal processing circuit portion which reads out and processes a signal from the magnetic sensor portion,
    wherein the magnetic sensor portion comprising:
        a magnetic film; and
        a metal electrode to be electrically coupled to the magnetic film, the metal electrode being provided with a plurality of protrusions,
    wherein the magnetic film is formed on top surfaces and sidewalls of the plurality of protrusions, and
    wherein at least three of the plurality of protrusions of the metal electrode are arranged at substantially the same pitch in the magnetic sensing portion.

2. The magnetic sensor according to claim 1,
    wherein the plurality of protrusions of the metal electrode is formed in a pattern of a comb shape, a ladder shape, or a dot shape.

3. The magnetic sensor according to claim 2,
    wherein the metal electrode is disposed on an oxide film,
    wherein the plurality of protrusions of the metal electrode is spaced apart from each other, and
    wherein the magnetic film is formed on the top surfaces, the sidewalls, and portions of the oxide film between the plurality of protrusions.

4. The magnetic sensor according to claim 2,
    wherein the metal electrode comprises connection portions that connect the plurality of protrusions of the metal electrode to each other, and
    wherein the magnetic film is formed on the top surfaces, the sidewalls, and the connection portions of the plurality of protrusions.

5. The magnetic sensor according to claim 1, wherein the magnetic film is a solid film without holes and spaces and is formed on the top surfaces and the sidewalls of the metal electrode.

6. The magnetic sensor according to claim 1, wherein the at least three of the plurality of protrusions of the metal electrode are in contact with each other.

7. A method for manufacturing a magnetic sensor which utilizes a magnetoresistance effect, the magnetic sensor including: a magnetic sensor portion; and a signal processing circuit portion which reads out and processes a signal from the magnetic sensor portion, the method comprising:
   providing a metal wiring film on a supporting substrate;
   processing the metal wiring film into a desired pattern shape to form a metal electrode having a plurality of protrusions, at least three of the plurality of protrusions of the metal electrode are arranged at substantially the same pitch in the magnetic sensing portion;
   providing a magnetic film on top surfaces and sidewalls of the plurality of protrusions of the metal electrode; and
   providing a passivation film on the magnetic film.

8. The method for manufacturing the magnetic sensor according to claim 7,
   wherein the processing the metal wiring film comprises etching the metal wiring film to a desired depth to provide the plurality of protrusions.

\* \* \* \* \*